(12) United States Patent
Adelmann et al.

(10) Patent No.: US 8,405,166 B2
(45) Date of Patent: Mar. 26, 2013

(54) DIELECTRIC LAYER FOR FLASH MEMORY DEVICE AND METHOD FOR MANUFACTURING THEREOF

(75) Inventors: Christoph Adelmann, Wilsele (BE); Johan Swerts, Kessel-Io (BE); Sven Van Elshocht, Leuven (BE); Jorge Kittl, Hamme-Mille (BE)

(73) Assignee: IMEC, Leuven (BE)

( * ) Notice: Subject to any disclaimer, the term of this patent is extended or adjusted under 35 U.S.C. 154(b) by 252 days.

(21) Appl. No.: 12/962,288

(22) Filed: Dec. 7, 2010

(65) Prior Publication Data

US 2011/0147900 A1   Jun. 23, 2011

Related U.S. Application Data

(60) Provisional application No. 61/288,218, filed on Dec. 18, 2009.

(51) Int. Cl.
*H01L 29/51* (2006.01)
*H01L 21/473* (2006.01)

(52) U.S. Cl. ............... 257/410; 257/635; 257/E21.272; 257/E29.272; 438/591

(58) Field of Classification Search ............ 257/E21.253
See application file for complete search history.

(56) References Cited

U.S. PATENT DOCUMENTS

| 5,155,658 | A | 10/1992 | Inam et al. | |
|---|---|---|---|---|
| 7,323,375 | B2 * | 1/2008 | Yoon et al. | 438/164 |
| 2002/0197489 | A1 | 12/2002 | Lee et al. | |
| 2006/0257305 | A1 | 11/2006 | Yang | |
| 2008/0044986 | A1 * | 2/2008 | Storbeck et al. | 438/471 |
| 2008/0121979 | A1 * | 5/2008 | Nishikawa et al. | 257/321 |
| 2008/0185633 | A1 | 8/2008 | Choi et al. | |
| 2008/0296739 | A1 | 12/2008 | Lee et al. | |
| 2009/0057753 | A1 | 3/2009 | Ino | |
| 2011/0020997 | A1 * | 1/2011 | Siprak | 438/308 |

FOREIGN PATENT DOCUMENTS

WO   WO 96/28384 A1   9/1996

OTHER PUBLICATIONS

Du Boulay et al., "GdAlO$_3$ perovskite", Acta Crystallographica, (2004), C60, i120-i122.
Geller et al., "Crystallographic Studies of Perovskite-like Compounds. II. Rare Earth Aluminates", Acta Cryst., (1956), 9, 1019.
Vasylechko et al., "Crystal structure and thermal expansion of orthorhombic perovskite-type RE aluminates", (2003), 9942.
Wachowski et al., "Studies of the physicochemical and surface properties of alumina modified with rare-earth oxides I. Preparation, structure and thermal stability", Materials Chemistry and Physics, 37, (1994), 29-38.

* cited by examiner

*Primary Examiner* — Stephen W Smoot
(74) *Attorney, Agent, or Firm* — Knobbe Martens Olson & Bear, LLP

(57) ABSTRACT

The present disclosure is related to a dielectric layer comprising a rare-earth aluminate ($RE_xAl_{2-x}O_3$ with $0<x<2$) and having a perovskite crystalline structure, wherein the rare-earth aluminate comprises a rare-earth element having an atomic number higher than or equal to 63 and lower than or equal to 71. The disclosure also relates to method of manufacturing of a dielectric stack and a dielectric stack comprising said rare-earth aluminate dielectric layer and further comprising a template stack comprising at least an upper template layer, wherein the upper template layer has a perovskite structure, and wherein the upper template layer is underlying and in contact with the rare-earth aluminate dielectric layer. In a preferred embodiment the dielectric stack further comprises a lower template layer having a crystalline structure, wherein the lower template layer is underlying and in contact with the upper template layer.

31 Claims, 7 Drawing Sheets

DIELECTRIC LAYER FOR FLASH MEMORY DEVICE AND METHOD FOR MANUFACTURING THEREOF

CROSS-REFERENCE TO RELATED APPLICATIONS

This application claims the benefit under 35 U.S.C. §119 (e) of U.S. provisional application Ser. No. 61/288,218, filed Dec. 18, 2009, the disclosure of which is hereby expressly incorporated by reference in its entirety and is hereby expressly made a portion of this application.

TECHNICAL FIELD OF THE DISCLOSURE

The present disclosure relates to the manufacturing of semiconductor devices. More specifically, the present disclosure is directed to rare-earth aluminate dielectric material and layer which are particularly suitable for non-volatile memory applications and in particular for integration in flash memory devices.

BACKGROUND OF THE DISCLOSURE

For future scaling of flash (non-volatile) memory devices, the inter-poly dielectric or blocking dielectric layers should be made of a dielectric material with a higher κ-value than $Al_2O_3$ and, at the same time, a band gap comparable or preferably larger than $Al_2O_3$. A class of materials that may be able to fulfill these requirements is the class of rare-earth (lanthanide) aluminates, i.e. alloys of rare-earth oxides with $Al_2O_3$.

US2008/0185633A1 discloses a charge trap memory device comprising: a tunnel insulating layer on a substrate; a charge trap layer on the tunnel insulating layer; and a blocking insulating layer on the charge trap layer, wherein the blocking insulating layer may be formed of a material including a lanthanide (Ln) so as to have a higher dielectric constant and a larger energy band-gap. Ln may refer to the 15 elements ranging from lanthanum (La) as the 57th element to lutetium (Lu) as the 71st element. The blocking insulating layer may further include aluminum and oxygen, wherein the ratio of lanthanide to aluminum may be greater than 1 (e.g., about 1.5 to about 2).

In particular, the application discloses LaAlO having an energy band-gap and a dielectric permittivity (κ) depending on the La/Al composition. $LaAlO_3$ with a La/Al composition ratio of 1 may have an energy band-gap of about 5.65 eV and a dielectric permittivity (κ) of about 12, while $La_4Al_2O_9$ with a La/Al composition ratio of 2 may have an energy band-gap of about 5.95 eV and a dielectric constant of about 20.

Although the performance of the lanthanum aluminates (LaAlO) disclosed in US2008/0185633A1 is superior to alumina in terms of dielectric permittivity (κ-value of thin film γ-$Al_2O_3$ is about 9), the band gap achieved is lower than that of thin film γ-$Al_2O_3$ (about 6.0-6.5 eV) and still too low for the most advanced flash memory devices.

There is therefore still a need for a dielectric material and layer, and for a process of manufacturing thereof, wherein the dielectric material possesses a κ-value higher than $Al_2O_3$ whilst providing a band gap comparable or preferably larger than $Al_2O_3$.

Advantageously, the dielectric material and layer according to the disclosure allow manufacturing semiconductor devices, in particular flash memory devices, with improved performance and characteristics.

Other advantages and benefits provided by the dielectric material and layer according to the disclosure, will be apparent from the following description and the accompanying drawings.

SUMMARY OF THE DISCLOSURE

According to one aspect, the present disclosure relates to a dielectric layer comprising (or consisting essentially of) (or consisting of) a rare-earth aluminate ($RE_xAl_{2-x}O_3$ with 0<x<2) and having a (stable) perovskite crystalline structure, wherein the rare-earth aluminate comprises (or consists of) a rare-earth element having an atomic number higher than or equal to (about) 63 and lower than or equal to (about) 71.

Preferably, the dielectric layer of the disclosure comprises (or consists of) a rare-earth aluminate ($RE_xAl_{2-x}O_3$ with 0<x<2), wherein the rare-earth element (RE) is selected from the group consisting of Eu, Gd, Tb, Dy, Ho, Er, Tm, Yb, Lu, and any combinations or mixtures thereof. More preferably, the rare-earth element (RE) is selected from the group consisting of Gd, Lu, and any combinations or mixtures thereof. More preferably, the rare-earth element (RE) is selected to be Gd or Lu.

Preferably, the dielectric layer of the disclosure comprises (or consists of) a rare-earth aluminate ($RE_xAl_{2-x}O_3$ with 0<x<2) which has a perovskite crystalline structure and which is stable at temperatures lower than (about) 1400° C., preferably lower than (about) 1200° C., more preferably lower than (about) 900° C.

Preferably, the dielectric layer of the disclosure comprising (or consisting of) a rare-earth aluminate ($RE_xAl_{2-x}O_3$ with 0<x<2) comprises (or consists of) $GdAlO_3$.

Preferably still, the dielectric layer of the disclosure comprising (or consisting of) a rare-earth aluminate ($RE_xAl_{2-x}O_3$ with 0<x<2) comprises (or consists of) $LuAlO_3$.

Preferably, the dielectric layer of the disclosure has a thickness lower than (about) 5 μm, preferably lower than (about) 1 μm, more preferably lower than (about) 500 nm, even more preferably lower than (about) 100 nm, still more preferably lower than (about) 50 nm, still more preferably lower than (about) 30 nm, still more preferably lower than (about) 20 nm. Preferably still, the dielectric layer of the disclosure has a thickness comprised between (about) 5 nm and (about) 30 nm, more preferably between (about) 10 nm and (about) 25 nm, still more preferably between (about) 10 nm and (about) 24 nm, still more preferably between (about) 10 nm and (about) 15 nm, still more preferably between (about) 12 nm and (about) 15 nm.

Preferably, the dielectric layer of the disclosure comprises (or consists of) a rare-earth aluminate ($RE_xAl_{2-x}O_3$ with 0<x<2) which has a band gap higher than (about) 5.5 eV, preferably higher than (about) 6.0 eV, more preferably higher than (about) 6.4 eV, even more preferably higher than (about) 6.4 eV, still more preferably higher than (about) 6.5 eV, still more preferably higher than (about) 7.0 eV, still more preferably higher than (about) 7.5 eV.

Preferably, the dielectric layer of the disclosure comprises (or consists of) a rare-earth aluminate ($RE_xAl_{2-x}O_3$ with 0<x<2) which has a κ-value higher than (about) 10, preferably higher than (about) 12, more preferably higher than (about) 15, even more preferably higher than (about) 18, still more preferably higher than (about) 20, still more preferably higher than (about) 22, still more preferably higher than (about) 25.

Preferably, the dielectric layer of the disclosure comprises (or consists of) a rare-earth aluminate ($RE_xAl_{2-x}O_3$ with 0<x<2) wherein the RE/Al ratio is of about 1, or alternatively said, x is of about 1. According to this specific aspect, the rare-earth aluminate comprised in the dielectric layer of the disclosure has the structure REAlO$_3$.

According to another aspect, the present disclosure relates to a dielectric stack comprising a dielectric layer as defined above.

Preferably, the dielectric stack of the disclosure further comprises a template stack comprising at least an upper template layer, wherein the upper template layer has a perovskite structure, and wherein the upper template layer is underlying and in contact with the rare-earth aluminate (RE$_x$Al$_{2-x}$O$_3$ with 0<x<2) dielectric layer.

Preferably, the dielectric stack of the disclosure further comprises a lower template layer having a crystalline structure, wherein the lower template layer is underlying and in contact with the upper template layer.

Preferably, in the dielectric stack of the disclosure, the lower template layer has a thickness lower than (about) 10 nm, more preferably lower than (about) 6 nm. Preferably still, in the dielectric stack of the disclosure, the lower template layer has a thickness higher than (about) 4 nm.

Preferably, in the dielectric stack of the disclosure, the upper template layer has a thickness lower than (about) 10 nm, more preferably lower than (about) 6 nm, even more preferably lower than (about) 5 nm. Preferably still, in the dielectric stack of the disclosure, the upper template layer has a thickness higher than (about) 4 nm.

According to one preferred aspect, in the dielectric stack of the disclosure, the lower template layer comprises (or consists of) γ-Al$_2$O$_3$.

According to one preferred aspect, in the dielectric stack of the disclosure, the upper template layer comprises (or consists in) LaAlO$_3$.

According to another preferred aspect, in the dielectric stack of the disclosure, the upper template layer comprises (or consists of) SrTiO$_3$. According to this preferred aspect of the dielectric stack of the disclosure, the upper template layer has preferably a thickness lower than (about) 10 nm, more preferably lower than (about) 6 nm, even more preferably lower than (about) 4 nm, still more preferably of (about) 2 nm.

According to another aspect of the present disclosure, it is provided a method for manufacturing a dielectric stack on a substrate, wherein the method comprises (or consists in) the steps of: (a) forming an upper template layer overlying the substrate; (b) applying a thermal treatment to the upper template layer overlying the substrate, thereby forming a crystalline upper template layer having a perovskite structure; (c) forming a dielectric layer comprising (or consisting of) a rare-earth aluminate (RE$_x$Al$_{2-x}$O$_3$ with 0<x<2) overlying the crystalline upper template layer, wherein the rare-earth aluminate (RE$_x$Al$_{2-x}$O$_3$ with 0<x<2) comprises (or consists of) a rare-earth element having an atomic number higher than or equal to (about) 63 and lower than or equal to (about) 71; and (d) applying a thermal treatment to the dielectric layer overlying the crystalline upper template layer, thereby forming a crystalline rare-earth aluminate (RE$_x$Al$_{2-x}$O$_3$ with 0<x<2) dielectric layer having a perovskite structure.

Preferably, in the method of the disclosure, the upper template comprises (or consists of) SrTiO$_3$ Preferably, the method for manufacturing a dielectric stack on a substrate according to the disclosure, comprises (or consists in) the steps of: (a) forming an upper template layer overlying the substrate, and wherein the upper template layer comprises (or consists of) SrTiO$_3$; (b) applying a thermal treatment to the upper template layer overlying the substrate, thereby forming a crystalline upper template layer comprising (or consisting of) SrTiO$_3$ and having a perovskite structure; (c) forming a dielectric layer comprising (or consisting of) a rare-earth aluminate (RE$_x$Al$_{2-x}$O$_3$ with 0<x<2) overlying the crystalline upper template layer, wherein the rare-earth aluminate (RE$_x$Al$_{2-x}$O$_3$ with 0<x<2) comprises (or consists of) a rare-earth element having an atomic number higher than or equal to (about) 63 and lower than or equal to (about) 71; and (d) applying a thermal treatment to the dielectric layer overlying the crystalline upper template layer, thereby forming a crystalline rare-earth aluminate (RE$_x$Al$_{2-x}$O$_3$ with 0<x<2) dielectric layer having a perovskite structure.

Preferably, in the method of the disclosure, the dielectric layer comprising (or consisting of) a rare-earth aluminate (RE$_x$Al$_{2-x}$O$_3$ with 0<x<2) comprises (or consists of) GdAlO$_3$.

Preferably still, in the method of the disclosure, the dielectric layer of the disclosure comprising (or consisting of) a rare-earth aluminate (RE$_x$Al$_{2-x}$O$_3$ with 0<x<2) comprises (or consists of) LuAlO$_3$.

Preferably, in the method of the disclosure, the thermal treatment (applied to the upper template layer) at step (b) and the thermal treatment (applied to the dielectric layer overlying the crystalline upper template layer) at step (d) as above-described are performed simultaneously, after step (c) of forming the dielectric layer comprising (or consisting of) a rare-earth aluminate (RE$_x$Al$_{2-x}$O$_3$ with 0<x<2).

Preferably, in the method of the disclosure, the thermal treatment (applied to the upper template layer) at step (b) is performed at a temperature comprised between (about) 600° C. and (about) 800° C.

Preferably, in the method of the disclosure, the thermal treatment (applied to the dielectric layer overlying the crystalline upper template layer) at step (d) is performed at a temperature comprised between (about) 830° C. and (about) 1000° C.

According to the particular aspect of the method of the disclosure wherein the dielectric layer comprising a rare-earth aluminate (RE$_x$Al$_{2-x}$O$_3$ with 0<x<2) comprises (or consists of) GdAlO$_3$, the thermal treatment (applied to the dielectric layer overlying the crystalline upper template layer) at step (d) is performed at a temperature comprised between (about) 830° C. and (about) 1000° C.

According to the particular aspect of the method of the disclosure wherein the dielectric layer comprising a rare-earth aluminate (RE$_x$Al$_{2-x}$O$_3$ with 0<x<2) comprises (or consists of) LuAlO$_3$, the thermal treatment (applied to the dielectric layer overlying the crystalline upper template layer) at step (d) is performed at a temperature comprised between (about) 930° C. and (about) 1000° C.

Preferably, in the method of the disclosure, the thermal treatment (applied to the upper template layer) at step (b) and the thermal treatment (applied to the dielectric layer overlying the crystalline upper template layer) at step (d) are annealing treatments.

Preferably, in the method of the disclosure, the thermal treatment (applied to the upper template layer) at step (b) and the thermal treatment (applied to the dielectric layer overlying the crystalline upper template layer) at step (d) are performed for a duration comprised between (about) 1 second to (about) 5 minutes, preferably between (about) 30 seconds and (about) 1 minute, more preferably for a duration of (about) 30 seconds.

Preferably, in the method of the disclosure, the thermal treatment (applied to the upper template layer) at step (b) and the thermal treatment (applied to the dielectric layer overlying the crystalline upper template layer) at step (d) are performed in an ambient selected from the group consisting of O$_2$, N$_2$, inert gases (preferably noble gases such as Ar or He), and any combinations or mixtures thereof. More preferably, the ambient is selected to comprise (or consist of) $N_2$.

According to another preferred aspect, the method of the disclosure further comprises the step of forming a lower template layer having a crystalline structure and overlying the substrate, wherein the lower template is underlying and in contact with the upper template layer.

Preferably, in the method of the disclosure, the lower template layer having a crystalline structure comprises (or consists of) $\gamma\text{-}Al_2O_3$.

According to one preferred aspect of the method of the disclosure wherein the lower template layer having a crystalline structure comprises (or consists of) $\gamma\text{-}Al_2O_3$, the step of forming a lower template layer having a crystalline structure and overlying the substrate, comprises (or consists in) the steps of: forming a lower template layer comprising (or consisting of) amorphous $Al_2O_3$ and overlying the substrate; and applying a thermal treatment to the lower template layer, thereby forming a crystalline $\gamma\text{-}Al_2O_3$ layer.

Preferably, in the method of the disclosure, the upper template comprises (or consists of) $LaAlO_3$.

According to another preferred aspect, the method for manufacturing a dielectric stack on a substrate according to the disclosure, comprises (or consists in) the steps of: (a) forming a lower template layer comprising (or consisting of) amorphous $Al_2O_3$ and overlying the substrate; (b) applying a thermal treatment to the lower template layer, thereby forming a crystalline gamma-alumina ($\gamma\text{-}Al_2O_3$) layer; (c) forming an upper template layer overlying the crystalline $\gamma\text{-}Al_2O3$ layer, wherein the upper template layer comprises (or consists of) $LaAlO_3$; (d) applying a thermal treatment to the upper template layer overlying the crystalline $\gamma\text{-}Al_2O3$ layer, thereby forming a crystalline $LaAlO_3$ upper template layer having a perovskite structure; (e) forming a dielectric layer comprising (or consisting of) a rare-earth aluminate ($RE_xAl_{2-x}O_3$ with $0<x<2$) overlying the crystalline $LaAlO_3$ upper template layer, wherein the rare-earth aluminate ($RE_xAl_{2-x}O_3$ with $0<x<2$) comprises (or consists of) a rare-earth element having an atomic number higher than or equal to (about) 63 and lower than or equal to (about) 71; and (f) applying a thermal treatment to the dielectric layer overlying the crystalline $LaAlO_3$ upper template layer, thereby forming a crystalline rare-earth aluminate ($RE_xAl_{2-x}O_3$ with $0<x<2$) dielectric layer having a perovskite structure.

Preferably, in the method of the disclosure, the dielectric layer comprising (or consisting of) a rare-earth aluminate ($RE_xAl_{2-x}O_3$ with $0<x<2$) comprises (or consists of) $GdAlO_3$.

Preferably still, in the method of the disclosure, the dielectric layer of the disclosure comprising (or consisting of) a rare-earth aluminate ($RE_xAl_{2-x}O_3$ with $0<x<2$) comprises (or consists of) $LuAlO_3$.

Preferably, in the method of the disclosure, the thermal treatment (applied to the lower template layer) at step (b) above is performed at a temperature comprised between (about) 850° C. and (about) 1100° C., preferably at (about) 850° C.

Preferably, in the method of the disclosure, the thermal treatment (applied to the upper template layer overlying the crystalline $\gamma\text{-}Al_2O3$ layer) at step (d) above is performed at a temperature comprised between (about) 950° C. and (about) 1100° C., preferably at (about) 1000° C.

Preferably, in the method of the disclosure, the thermal treatment (applied to the dielectric layer overlying the crystalline $LaAlO_3$ upper template layer) at step (f) above is performed at a temperature comprised between (about) 780° C. and (about) 1050° C., preferably between (about) 910° C. and (about) 1050° C., more preferably between (about) 950° C. and (about) 1050° C., even more preferably at (about) 1050° C.

According to the particular aspect of the method of the disclosure wherein the dielectric layer comprising (or consisting of) a rare-earth aluminate ($RE_xAl_{2-x}O_3$ with $0<x<2$) comprises (or consists in) $GdAlO_3$, the thermal treatment (applied to the dielectric layer overlying the crystalline $LaAlO_3$ upper template layer) at step (f) above is performed at a temperature comprised between (about) 780° C. and (about) 1050° C.

According to the particular aspect of the method of the disclosure wherein the dielectric layer comprising (or consisting of) a rare-earth aluminate ($RE_xAl_{2-x}O_3$ with $0<x<2$) comprises (or consists in) $LuAlO_3$, the thermal treatment (applied to the dielectric layer overlying the crystalline $LaAlO_3$ upper template layer) at step (f) above is performed at a temperature comprised between (about) 910° C. and (about) 1050° C.

Preferably, in the method of the disclosure, the thermal treatment (applied to the upper template layer overlying the crystalline $\gamma\text{-}Al_2O3$ layer) at step (d) above and the thermal treatment (applied to the dielectric layer overlying the crystalline $LaAlO_3$ upper template layer) at step (f) above are performed simultaneously, after step (e) of forming the dielectric layer comprising a rare-earth aluminate ($RE_xAl_{2-x}O_3$ with $0<x<2$).

Preferably, in the method of the disclosure, the thermal treatment (applied to the lower template layer) at step (b) above, the thermal treatment (applied to the upper template layer overlying the crystalline $\gamma\text{-}Al_2O3$ layer) at step (d) above, and the thermal treatment (applied to the dielectric layer overlying the crystalline $LaAlO_3$ upper template layer) at step (f) above, are annealing treatments.

Preferably, in the method of the disclosure, the thermal treatment (applied to the lower template layer) at step (b) above, the thermal treatment (applied to the upper template layer overlying the crystalline $\gamma\text{-}Al_2O3$ layer) at step (d) above, and the thermal treatment (applied to the dielectric layer overlying the crystalline $LaAlO_3$ upper template layer) at step (f) above, are performed for a duration comprised between (about) 1 second to (about) 5 minutes, preferably between (about) 30 seconds and (about) 1 minute, more preferably for a duration of (about) 30 seconds.

Preferably, in the method of the disclosure, the thermal treatment (applied to the lower template layer) at step (b) above, the thermal treatment (applied to the upper template layer overlying the crystalline $\gamma\text{-}Al_2O3$ layer) at step (d) above, and the thermal treatment (applied to the dielectric layer overlying the crystalline $LaAlO_3$ upper template layer) at step (f) above, are performed in an ambient selected from the group consisting of $O_2$, $N_2$, inert gases (preferably noble gases such as Ar or He), and any combinations or mixtures thereof. More preferably, the ambient is selected to comprise (or consist of) $N_2$.

According to still another aspect of the present disclosure, it is provided a semiconductor device comprising a dielectric layer or a dielectric stack as described above. Preferably, the semiconductor device is a non-volatile memory device, more preferably a flash memory device.

According to still another aspect, the present disclosure relates to the use of a dielectric layer or a dielectric stack or a method as described above in the manufacture of a semiconductor device, preferably a flash memory device.

BRIEF DESCRIPTION OF THE DRAWINGS

All drawings are intended to illustrate some aspects and embodiments of the present disclosure. The drawings described are only schematic and are non-limiting.

DETAILED DESCRIPTION OF THE DISCLOSURE

Figure 1:
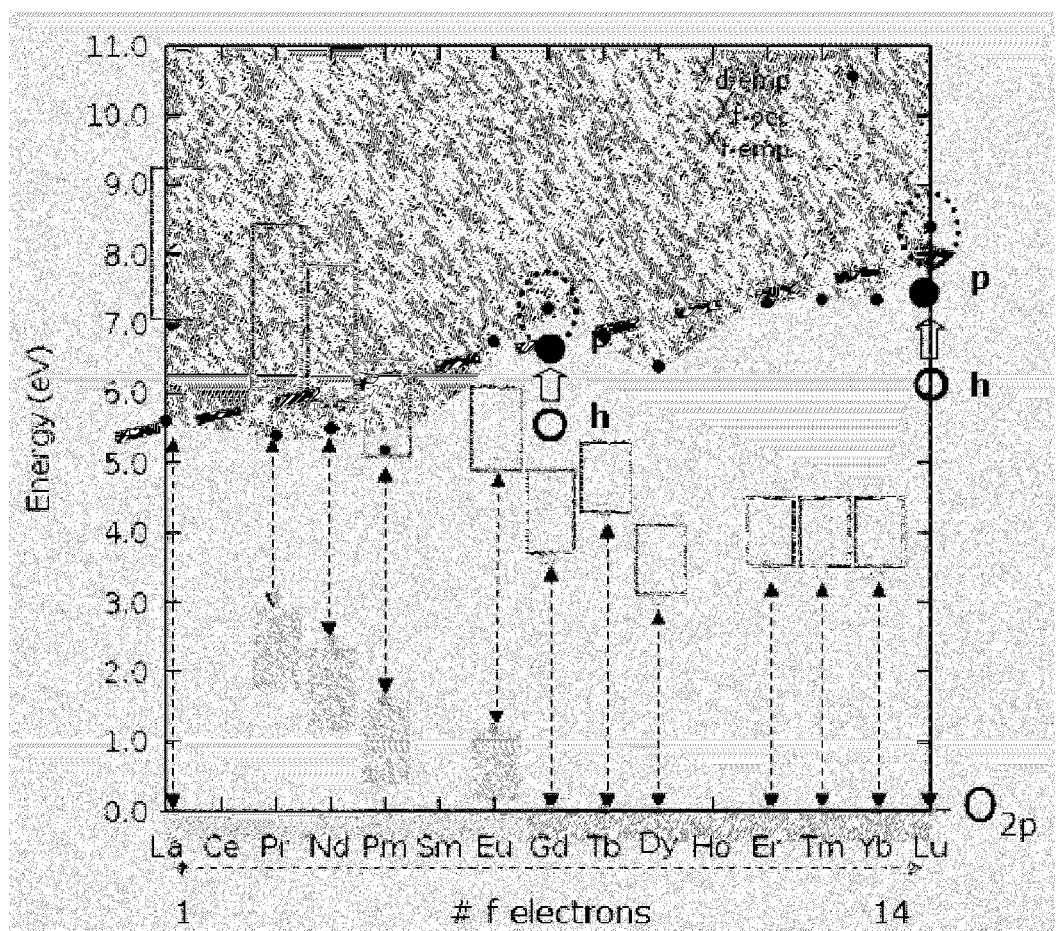
FIG. 1 represents the band gap values (eV) of the rare-earth aluminates as a function of the rare-earth element comprised.

An aim of the present disclosure is to provide a dielectric layer made of rare-earth aluminate with a perovskite structure.

Another aim is to provide dielectric stack comprising the rare-earth aluminate with a perovskite structure, the dielectric stack being suitable to be used in a flash memory device and having improved performance with respect to the state of the art.

Yet another aim is to provide a method of manufacturing of the dielectric stack comprising a rare-earth aluminate with a perovskite structure.

Rare-earth aluminates (RE$_x$Al$_{2-x}$O$_3$, with 0<x<2) are dielectric materials (oxides) comprising at least one rare-earth element (RE), aluminum (Al) and oxygen. Rare earth elements or rare earth metals are a collection of seventeen chemical elements in the periodic table, namely scandium (Sc), yttrium (Y), and the fifteen lanthanides (Ln): lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). The concentration "x" of the rare-earth element (RE) and of Al in the rare-earth aluminate compound may vary.

Throughout the disclosure, and unless otherwise specified, the ratio RE/Al is preferably such that RE/Al=1, or x=1. However, throughout the present disclosure, the term REAlO₃ is also meant to refer to rare-earth aluminates (RE$_x$Al$_{2-x}$O$_3$, with 0<x<2).

Throughout the present description, the expressions "consisting of" or "consisting essentially of" are used interchangeably and are meant to have the same meaning.

Charge trap memory devices comprising a blocking insulating layer made of a material consisting of a lanthanide (Ln), aluminum and oxygen have been previously disclosed. However, simply replacing lanthanum with another lanthanide or rare-earth element in the lanthanum-aluminate (LaAlO) material of the dielectric (blocking) layer does not necessarily improve the characteristics of the blocking layer such as the dielectric permittivity (γ-value) and the band gap value.

As further disclosed in different embodiments, the κ-value and the band gap of the rare-earth aluminate compounds depend both on the rare-earth element comprised and on the crystalline structure of the rare-earth aluminate.

In a first aspect of the disclosure a rare-earth aluminate (RE$_x$Al$_{2-x}$O$_3$, 0<x<2) dielectric layer is disclosed having a perovskite crystalline structure at temperatures compatible with semiconductor manufacturing, wherein the rare-earth aluminate comprises a rare-earth element (RE) having an atomic number higher or equal with 63 (Eu) and lower or equal with 71 (Lu).

In the context of the present disclosure, the expression "a dielectric layer having a perovskite crystalline structure at temperatures compatible with semiconductor manufacturing" is meant to express that the dielectric layer has a perovskite crystalline structure which is stable (i.e. substantially unaffected) at temperatures lower than 1400° C., preferably lower than 1200° C., more preferably lower than 900° C.

The RE element can be selected from the group consisting of Eu, Gd, Tb, Dy, Ho, Er, Tm, Yb, Lu, and any combinations or mixtures thereof. Rare-earth aluminates comprising two or more rare-earth (RE) elements from the group above are also part of the disclosure.

A material having a perovskite structure is any material with the same type of crystal structure as calcium titanium oxide (CaTiO3), known as the perovskite structure. The general chemical formula for perovskite compounds is ABX3, where 'A' and 'B' are two cations of very different sizes, and X is an anion that bonds to both. The 'A' atoms are larger than the 'B' atoms. The ideal cubic-symmetry structure has the B cation in 6-fold coordination, surrounded by an octahedron of anions, and the A cation in 12-fold cuboctahedral coordination. The perovskite structure is adopted by many oxides that have the chemical formula ABO3. In the idealized cubic unit cell of such a compound, type 'A' atom sits at cube corner positions (0, 0, 0), type 'B' atom sits at body centre position (½, ½, ½) and oxygen atoms sit at face centered positions (½, ½, 0). The orthorhombic and tetragonal phases are most common non-cubic variants.

Manufacturing a REAlO₃ in a perovskite phase is not straightforward, especially in the case of the rare-earth aluminates comprising a rare-earth element with a high atomic number. Some of these rare-earth aluminates do not show stable perovskites structures at temperatures compatible with semiconductor manufacturing (e.g. lower than 1400° C., preferably lower than 1200° C.). For example, the perovskite phase for $LuAlO_3$ is only stable above 1800° C. (in bulk). Moreover, little is known about $REAlO_3$ crystallization behavior in thin films (as they are needed for manufacturing semiconductor devices), since phase diagrams are available only for bulk materials.

The rare-earth aluminate dielectric layer ($RE_xAl_{2-x}O_3$, 0<x<2) having a perovskite structure is preferably a thin film having a thickness lower than few microns, more preferably lower than 1 μm. In one aspect of the disclosure wherein the rare-earth aluminate dielectric layer is part of a dielectric stack of a flash memory device, its thickness is preferably lower than 100 nm, more preferably lower than 30 nm, even more preferably lower than 20 nm.

The rare-earth aluminate dielectric layer of the disclosure has a stable perovskite crystalline structure at temperatures compatible with semiconductor manufacturing, i.e. at temperatures lower than 1400° C., preferably lower than 1200° C., more preferably lower than 900° C.

In one preferred aspect of the disclosure, the rare-earth aluminate ($RE_xAl_{2-x}O_3$, 0<x<2) dielectric layer with a perovskite structure has a RE/Al ratio of about 1 (or x is about 1). Both the Al-rich and the RE-rich rare-earth aluminates tend to form other crystalline phases than perovskite. Advantageously, the band-gap and the dielectric permittivity (κ-value) of the perovskite rare-earth aluminates are the largest when compared to the corresponding values of other crystalline phases of the same compounds.

In one preferred aspect of the disclosure, the $REAlO_3$ dielectric layer with a perovskite structure comprises $Lu_xAl_{2-x}O_3$ with x being about 1. In specific aspects of the disclosure as further described in detail, the $REAlO_3$ dielectric layer with perovskite structure consists of $LuAlO_3$.

In another preferred aspect of the disclosure, the $REAlO_3$ dielectric layer with a perovskite structure comprises $Gd_xAl_{2-x}O_3$ with x being about 1. In specific aspects of the disclosure as further described in detail, the $REAlO_3$ dielectric layer with perovskite structure consists of $GdAlO_3$.

In a second aspect of the present disclosure a dielectric stack is disclosed, comprising: the $REAlO_3$ dielectric layer having a perovskite structure at temperatures compatible with semiconductor manufacturing, wherein the rare-earth aluminate comprises a rare-earth element (RE) having an atomic number higher or equal with 63 (Eu) and lower or equal with 71 (Lu), and a template stack comprising at least an upper template layer, wherein the upper template layer has a perovskite structure, and wherein the upper template layer is underlying and in contact with the $REAlO_3$ dielectric layer.

In one aspect of the disclosure, the template stack comprises at least an upper template layer with a perovskite structure. The template stack can comprise further a lower template layer having a crystalline structure, wherein the lower template layer is underlying and in contact with the upper template layer.

In a different aspect of the disclosure, the template stack consists of two layers: a lower template layer having a crystalline structure and an upper template layer having a perovskite structure.

The lower template layer, having a crystalline structure and underlying and in contact with the upper template layer determines the crystallization of the upper template layer into a perovskite phase.

In some aspects of the disclosure, which are illustrated in detail elsewhere in the description, the lower template layer consists of γ-Al2O3 and the upper template layer consists of $LaAlO_3$. Advantageously, the $LaAlO_3$ upper template has a high κ-value, while the γ-Al2O3 lower template layer can be kept thin, with a minor contribution to the equivalent oxide thickness of the whole dielectric stack.

The crystalline structure of γ-$Al_2O_3$ is often described as a defect cubic spinel structure with vacancies on part of the cation positions. Each unit cell contains 32 oxygen and 64/3 aluminum ions to fulfill stoichiometry.

In alternative aspects of the disclosure, the template stack consists of an upper template layer with a perovskite structure.

The upper template layer can be made of any crystalline material having a perovskite structure at temperatures compatible with semiconductor manufacturing, or being capable to crystallize in a perovskite structure at temperatures compatible with semiconductor manufacturing when in contact and overlying with another crystalline material (lower template layer). Suitable crystalline material for use herein may be easily identified by those skilled in the art in the light of the present disclosure. The crystalline material of the upper template layer should preferably have dielectric properties which make it suitable to be used in a dielectric stack of a semiconductor device, in particular of a flash memory device.

In one preferred aspect of the disclosure, the upper template layer comprises $SrTiO_3$ (STO) having a perovskite structure.

In some preferred aspects of the disclosure which are illustrated in detail elsewhere in the description, the upper template layer consists of $SrTiO_3$ having a perovskite structure.

FIG. 1 represents the band gap values (eV) of the rare-earth aluminates as a function of the rare-earth element (i.e. the number of electrons in the f orbitals).

The simulated (predicted) band gap values for the perovskite structures of the different $REAlO_3$ are represented by small full dots at the edge of the RE d-Al p band (light grey upper region). The energy values of RE f-empty band and the RE f-occupied band are represented by empty- and respectively full-light grey rectangles. FIG. 1 shows that the band-gap values are increasing with the atomic number or the number of electrons in the f orbitals.

The measured band gap values (by e.g. X-ray photoelectron-Electron Energy Loss Spectroscopy, XPS-EELS) for $GdAlO_3$ and, respectively, $LuAlO_3$ are represented in FIG. 1 by big full circles (perovskite phase) and big empty circles (hexagonal phase). As shown, the band gaps of perovskite RE aluminates are larger by more than 1 eV (1.3 for $LuAlO_3$ and, respectively, 1.0 eV for $GdAlO_3$) than those of the hexagonal RE aluminates for the same rare-earth element and the same RE/Al composition.

As shown in FIG. 1, the measured band gaps of the perovskite phases are still slightly lower than the predicted ones (small dots surrounded by dotted circle in case of $GdAlO_3$ and $LuAlO_3$) or than those found experimentally for bulk crystals. Without wishing to be bound by theory, it is believed this is explained by the influence of defects in thin layers.

Photoconductivity measurements show that the hexagonal $GdAlO_3$ has a band gap of 5.5 eV. For higher Gd concentrations, e.g. $Gd_{1.4}Al_{0.6}O_3$ the band gap has a value of about 5.3 eV, while for lower Gd concentrations e.g. $Gd_{0.5}Al_{1.5}O_3$ the band gap has a value of about 5.9 eV. These band gap values are situated in between the band gaps of $Gd_2O_3$ (about 5.2 eV) and $Al_2O_3$ (about 6.0-6.5 eV) and therefore not enough to justify the replacement of $Al_2O_3$ in flash memory devices, even when considering the benefits of a higher κ-value of about 12 for 25% Gd to about 18 for 70% Gd.

Photoconductivity measurements of hexagonal $Lu_xAl_{2-x}O_3$ shows a band gap of about 6.1 eV, more close to the band gap value of $Al_2O_3$, independent of the Lu concentration (x=0.5 to x=1.5). This band gap value does not justify the replacement of $Al_2O_3$ in flash memory devices, especially since the κ-value measured for hexagonal $LuAlO_3$ is about 10, rather low for a significant improvement in the performance of a flash memory devices based hereupon.

In a particular example, perovskite $REAlO_3$ layers (RE=Gd, Lu) are crystallized on a template stack consisting of a lower template layer of γ-$Al_2O_3$ (4 nm) and, thereupon an upper template layer of $LaAlO_3$ (5 nm). In a comparative example, hexagonal phases of the $REAlO_3$ are formed (crystallized) on silicon nitride ($Si_3N_4$, 6 nm).

Figure 2:
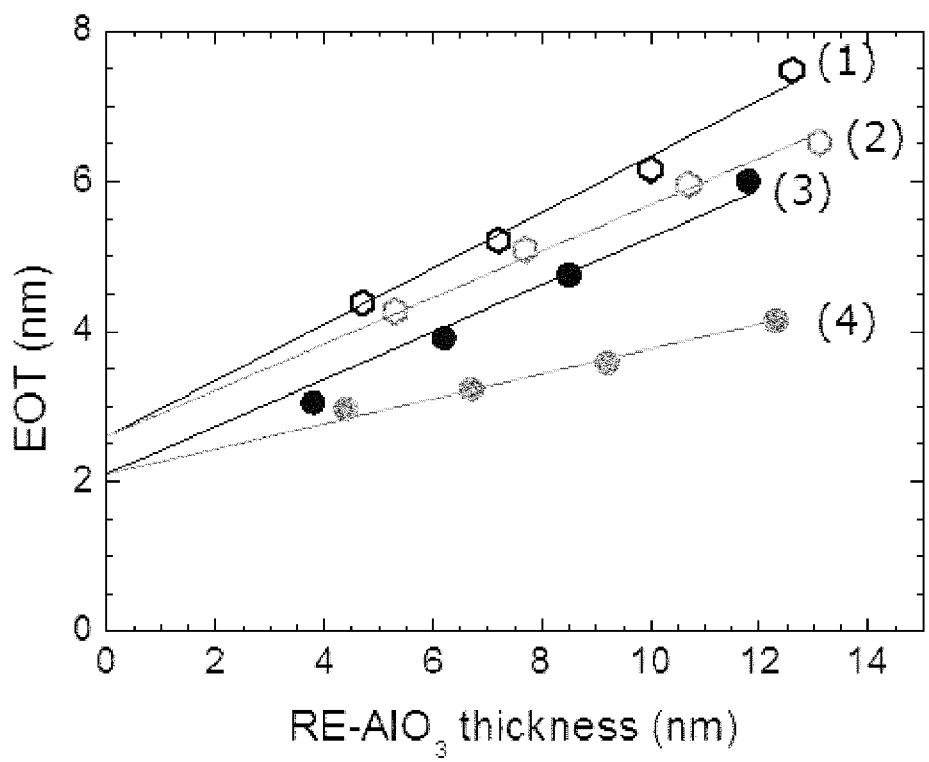
FIG. 2 represents the equivalent oxide thickness (EOT) of the hexagonal LuAlO₃ (1), hexagonal GdAlO₃ (2), perovskite LuAlO₃ (3) and perovskite GdAlO₃ (4) layers as function of the actual (physical) thickness of the same layer.

FIG. 2 represents the equivalent oxide thickness (EOT) of the hexagonal $LuAlO_3$ (1), hexagonal $GdAlO_3$ (2), perovskite $LuAlO_3$ (3) and perovskite $GdAlO_3$ (4) layers as function of the actual (physical) thickness of the layer.

The dielectric permittivity is extracted for the perovskite phases of $LuAlO_3$ and $GdAlO_3$ and, respectively, for the hexagonal phases of the same compounds. As shown in Table 1, the κ-values of the perovskite RE-aluminates are higher than those of the hexagonal phases.

TABLE 1

| κ-value | Hexagonal | Perovskite |
|---|---|---|
| $GdAlO_3$ | 14 | 23 |
| $LuAlO_3$ | 10 | 13 |

The combined interpretation of FIG. 1 and FIG. 2 shows that, for each rare-earth element, the perovskite structure of the $REAlO_3$ is having the highest band gap and the highest κ-value when compared with the corresponding values of the hexagonal phase. Further, based on the band gap value and the κ-value, a class of rare-earth aluminates having perovskite structure emerges as particularly suitable to be implemented as dielectric blocking layers in flash memory devices.

The perovskite rare-earth aluminates $REAlO_3$ comprising rare-earth elements with an atomic number higher or equal with 63 (Eu) and lower or equal with 71 (Lu) have a band gap higher than 6.4 eV and a κ-value higher than 12 which makes them suitable to be implemented as dielectric (blocking) layers in flash memory devices.

Figure 4:
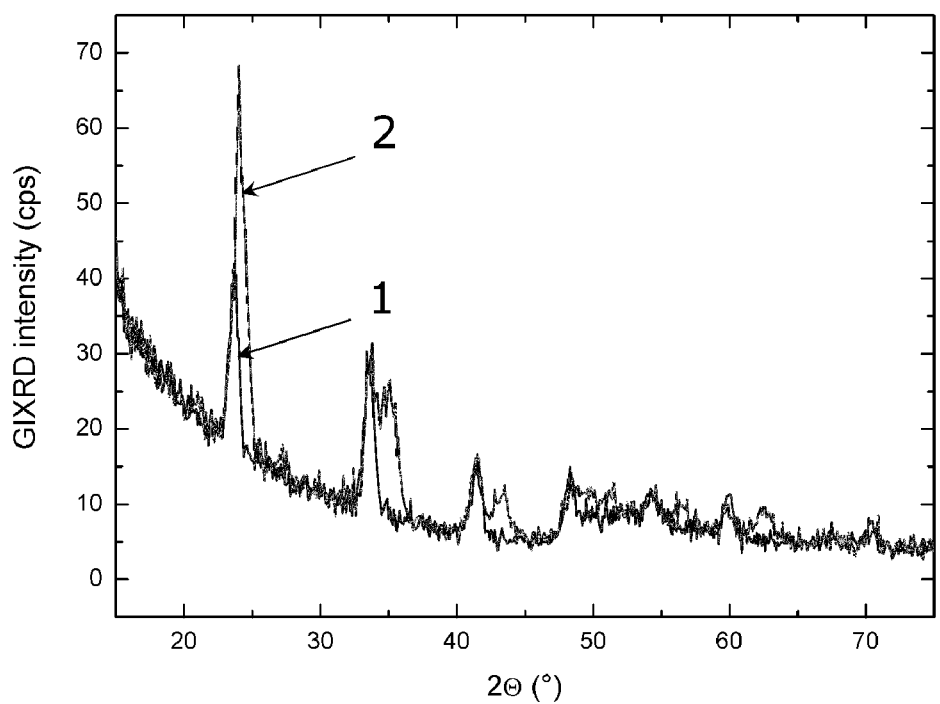
FIG. 4 represents the GIXRD patterns of the annealed dielectric stack composed of (1) 15 nm LaAlO₃/10 nm γ-Al₂O₃ and (2) 12 nm LuAlO₃/15 nm LaAlO₃/10 nm γ-Al₂O₃, showing that both LaAlO₃ and LuAlO₃ have crystallized into the perovskite phase.
Figure 5:
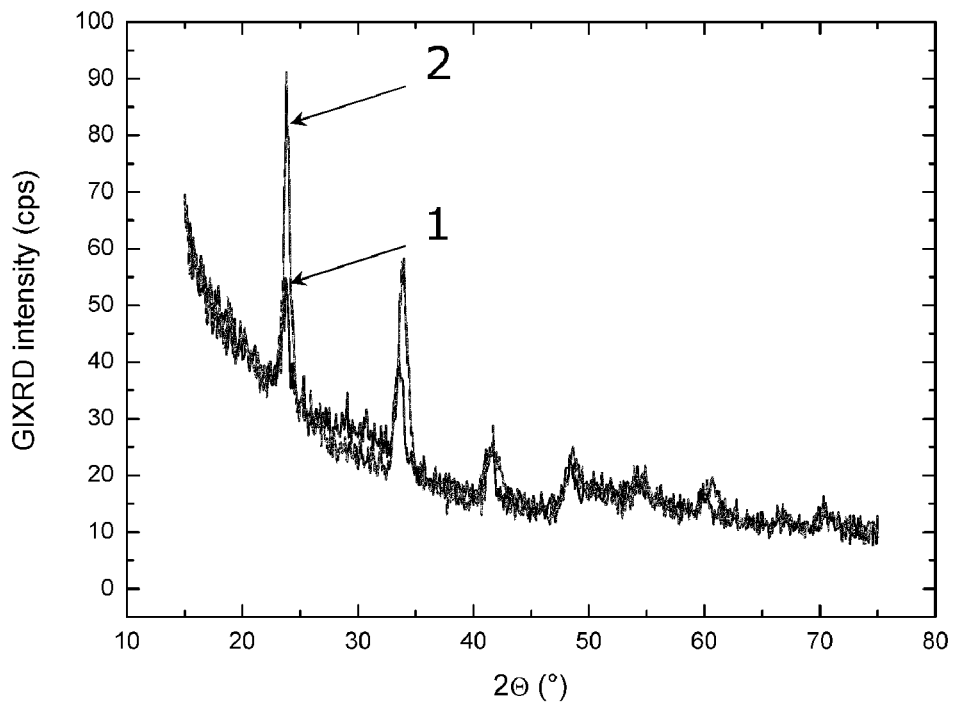
FIG. 5 represents the GIXRD patterns of the annealed dielectric stack composed of (1) 15 nm LaAlO₃/10 nm γ-Al₂O₃ and (2) 12 nm GdAlO₃/15 nm LaAlO₃/10 nm γ-Al₂O₃, showing that both LaAlO₃ and GdAlO₃ have crystallized into the perovskite phase.

The perovskite phase of $LaAlO_3$ can be obtained by annealing from the amorphous phase when grown/deposited on γ-$Al_2O_3$ as shown in FIG. 4 (curve 1) and FIG. 5 (curve 1).

We surprisingly found out that the rare-earth aluminates comprising Gd or Lu do not crystallize in a perovskite structure when crystallized from an amorphous layer deposited directly (overlying and in contact) on a γ-$Al_2O_3$ layer, in contrast with the behavior of $LaAlO_3$. Without wishing to be bound by theory, a similar behavior is expected from the other rare-earth elements with a high atomic number Z, i.e. a Z value between 63 and 71.

Figure 3:
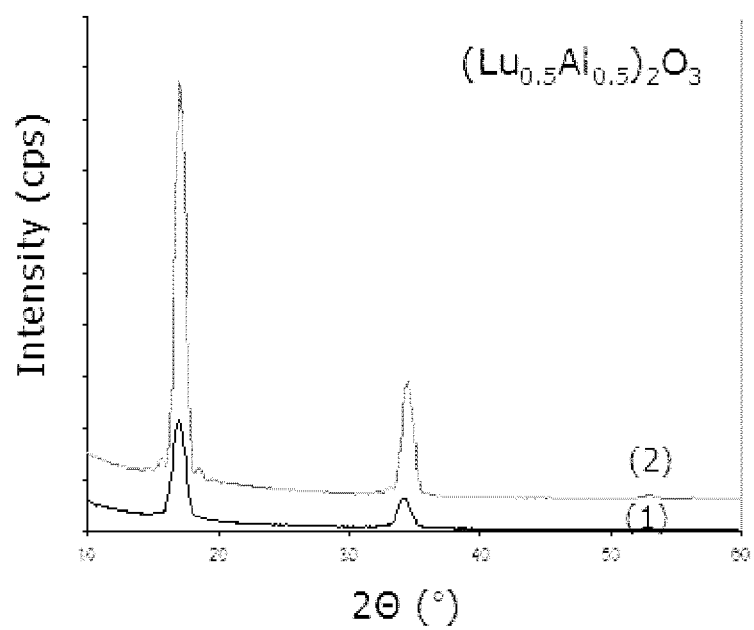
FIG. 3 represents the GIXRD (Grazing Incidence X-ray Diffraction) patterns of dielectric stack comprising a layer of LuAlO₃ overlying and in contact with γ-Al₂O₃, after annealing at 1000° C. (curve 1) and 1100° C. (curve 2) for 30 s in N₂, showing crystallization in a hexagonal phase.

In a comparative example it is shown that $GdAlO_3$ and $LuAlO_3$ crystallize in a hexagonal phase when grown directly on thin $SiO_2$ ($SiO_2$ thin compared to $REAlO_3$), $Si_3N_4$, or γ-$Al_2O_3$. The GIXRD pattern of $LuAlO_3$/γ-$Al_2O_3$ after annealing at 1000° C. (curve 1) and 1100° C. (curve 2) shows crystallization in the hexagonal phase, as represented in FIG. 3.

In some aspects of the disclosure, the template stack consists of an upper template layer with a perovskite structure.

In some aspects of the disclosure, the upper template layer is made of crystalline $SrTiO_3$ having a perovskite or a similar crystalline structure.

An amorphous rare-earth aluminate deposited on perovskite $SrTiO_3$ crystallizes in a perovskite structure having a higher κ-value and a larger band gap than the κ-value and, respectively, the band gap of the e.g. hexagonal rare-earth aluminate.

Advantageously, a $SrTiO_3$ perovskite upper template layer has a very large dielectric permittivity (κ-value) of about 100-300, depending on composition and crystallinity, which contributes to the improved dielectric properties of the whole dielectric stack. The somewhat lower band gap of $SrTiO_3$ is not a real drawback since the upper template layer is positioned at the bottom of the dielectric stack, underlying a layer with a higher band gap value, i.e. a $REAlO_3$ dielectric layer, which is functioning as a dielectric blocking layer.

In some preferred aspects of the disclosure, both the upper and the lower template layer as parts of the template stack should be made as thin as possible to minimize their contribution to the κ-value and band gap value of the whole dielectric stack.

In some preferred aspects of the disclosure, the thickness of the lower template layer is lower 10 nm, preferably lower than 6 nm.

In the particular aspect of the disclosure wherein the lower template layer is made of γ-$Al_2O3$, the thickness of γ-$Al_2O_3$ is preferably lower than 6 nm to minimize its contribution to the EOT of the whole dielectric stack.

Further, for the optimum working of the γ-$Al_2O_3$ as lower template layer, i.e. the lower template layer to induce the perovskite structure in the upper template layer ($LaAlO_3$) during crystallization, a minimum thickness of about 4 nm γ-$Al_2O_3$ shall be preferably respected. Experiments have shown than an unwanted hexagonal phase is (or may be) appearing in the $LaAlO_3$ upper template for γ-$Al_2O_3$ lower template layers thinner than 4 nm. Depending on the thickness employed, the EOT contribution of the γ-$Al_2O_3$/LaAlO3 template stack is about 2 nm or higher.

In some preferred aspects of the disclosure, the upper template layer, (e.g. perovskite $LaAlO_3$) has a thickness lower than 10 nm, preferably lower than 6 nm.

In scaled devices it is particularly important to scale down the thickness of the upper template layer as well, up to thicknesses lower than 5 nm. Further, a minimum thickness of about 4 nm is preferably respected for the optimum working of the upper template, i.e. the upper template layer to induce the perovskite structure in the $REAlO_3$ dielectric layer during crystallization.

In the alternative aspects wherein the upper template layer consists of $SrTiO_3$, the thickness of $SrTiO_3$ is preferably lower than 10 nm, more preferably lower than 6 nm, even more preferably about 2 nm. Advantageously, the EOT contribution of the STO upper template layer to the EOT of the whole dielectric stack is very small.

In some preferred aspects of the disclosure, the thickness of the rare-earth aluminate dielectric layer is between 10 nm and 24 nm, preferably between 12 nm and 15 nm.

Preferably, the upper and the lower template layers, the $REAlO_3$ dielectric layer and the other (optional) layers comprised in the dielectric stack are deposited by Atomic Layer Deposition (ALD) or a Chemical Vapor Deposition (CVD) technique such as Metal-organic Chemical Vapor Deposition (MOCVD) or grown by Molecular Beam Epitaxy (MBE).

In a particular example 10 nm $Al_2O_3$ was deposited by ALD on a Si substrate, followed by crystallization at about 850° C. for about 30 s in $N_2$ ambient to form γ-$Al_2O_3$. Thereafter, 15 nm $LaAlO_3$ was deposited by ALD on the crystallized γ-$Al_2O_3$ and annealed at about 1000° C. for about 30 s in $N_2$ ambient to form perovskite $LaAlO_3$. Overlying the perovskite LaAlO$_3$, 12 nm LuAlO$_3$ and, respectively in another example, 12 nm GdAlO$_3$ was deposited by ALD followed by annealing at about 1050° C. for about 30 s in N$_2$ ambient to form perovskite LuAlO$_3$ and, respectively, perovskite GdAlO$_3$.

FIG. 4 represents the GIXRD pattern of the annealed dielectric stack composed of (from top to bottom): (1) 15 nm LaAlO$_3$/10 nm γ-Al$_2$O$_3$ and (2) 12 nm LuAlO$_3$/15 nm LaAlO$_3$/10 nm γ-Al$_2$O$_3$. The patterns in FIG. 4 show that both LaAlO$_3$ and LuAlO$_3$ crystallized into the perovskite phase. LuAlO$_3$ crystallizes into perovskite phase with slightly smaller lattice parameter (a=3.64 Ångstrom) than LaAlO3 (a=3.76 Ångstrom), shown by the slightly shift of the peaks towards higher angles. No mixing of the two perovskites occurs.

FIG. 5 represents the GIXRD pattern of the annealed dielectric stack composed of (from top to bottom): (1) 15 nm LaAlO$_3$/10 nm γ-Al$_2$O$_3$ and (2) 12 nm GdAlO$_3$/15 nm LaAlO$_3$/10 nm γ-Al$_2$O$_3$. The patterns in FIG. 5 show that both LaAlO$_3$ and GdAlO$_3$ crystallized into the perovskite phase. GdAlO$_3$ crystallizes into perovskite phase with a lattice parameter (a=3.73 Ångstrom), very close to the lattice parameter of LaAlO$_3$ (a=3.76 Ångstrom).

Transmission Electron Microscopy (TEM) pictures of REAlO$_3$/LaAlO$_3$/γ-Al$_2$O$_3$ dielectric stacks show separate REAlO$_3$ and LaAlO$_3$ layers and continuity of the crystalline planes and of the crystal orientation through the REAlO$_3$/LaAlO$_3$ interface, for both rare-earth elements (Gd and Lu). The crystallized template layer (LaAlO$_3$) is thinner than the as grown/deposited layer because of densification during annealing.

Consistent with TEM results, XPS (X-ray Photoelectron Spectroscopy) sputter profiles of the GdAlO$_3$/LaAlO$_3$/γ-Al$_2$O$_3$ and LuAlO$_3$/LaAlO$_3$/γ-Al$_2$O$_3$ dielectric stacks show that GdAlO$_3$ and, respectively, LuAlO$_3$ do not inter-diffuse with LaAlO$_3$/Al$_2$O$_3$ template stack.

Alternatively, in another example, 15 nm SrTiO$_3$ template was deposited by ALD on a substrate, followed by crystallization at about 600° C. for 1 min in N$_2$ ambient to form perovskite SrTiO$_3$. Thereafter, 12 nm GdAlO$_3$ was deposited by ALD on the crystallized perovskite SrTiO$_3$ and then annealed at about 1000° C. for about 30 s in N$_2$ ambient to form perovskite GdAlO$_3$.

Figure 6:
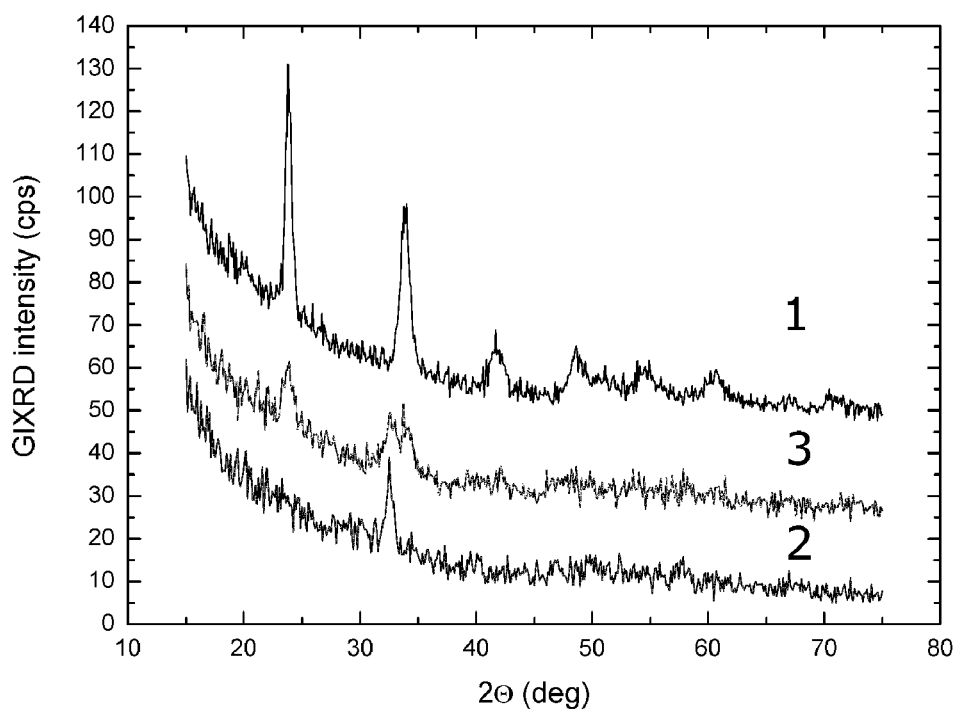
FIG. 6 represents the GIXRD patterns of the annealed dielectric stack composed of (1) 12 nm GdAlO₃/15 nm LuAlO₃/10 nm γ-Al₂O₃, (2) 12 nm GdAlO₃/15 nm SrTiO₃ (STO) as deposited, and (3) 12 nm GdAlO₃/15 nm SrTiO₃ (STO) annealed.

FIG. 6 represents the GIXRD patterns of the annealed dielectric stack composed (from top to bottom) of (1) 12 nm GdAlO$_3$/15 nm LaAlO$_3$/10 nm γ-Al$_2$O$_3$, (2) 12 nm GdAlO$_3$/15 nm SrTiO$_3$ as deposited, and (3) 12 nm GdAlO$_3$/15 nm SrTiO$_3$ annealed.

Transmission Electron Microscopy (TEM) pictures of the annealed (1050° C.) STO-comprising dielectric stack show separate layers in case of GdAlO$_3$/SrTiO$_3$, while in case of LuAlO$_3$/SrTiO$_3$ the layers are not clearly separated. In both cases, continuity of crystalline planes and of the crystal orientation through the REAlO$_3$/SrTiO$_3$ interface is observed. These results are confirmed by the X-ray Photoelectron Spectroscopy (XPS) results. XPS sputter profiles show some inter-diffusion between GdAlO$_3$ and SrTiO$_3$ although separate layers can still be defined, while LuAlO$_3$ and SrTiO$_3$ seem to fully inter-diffuse.

Figure 7:
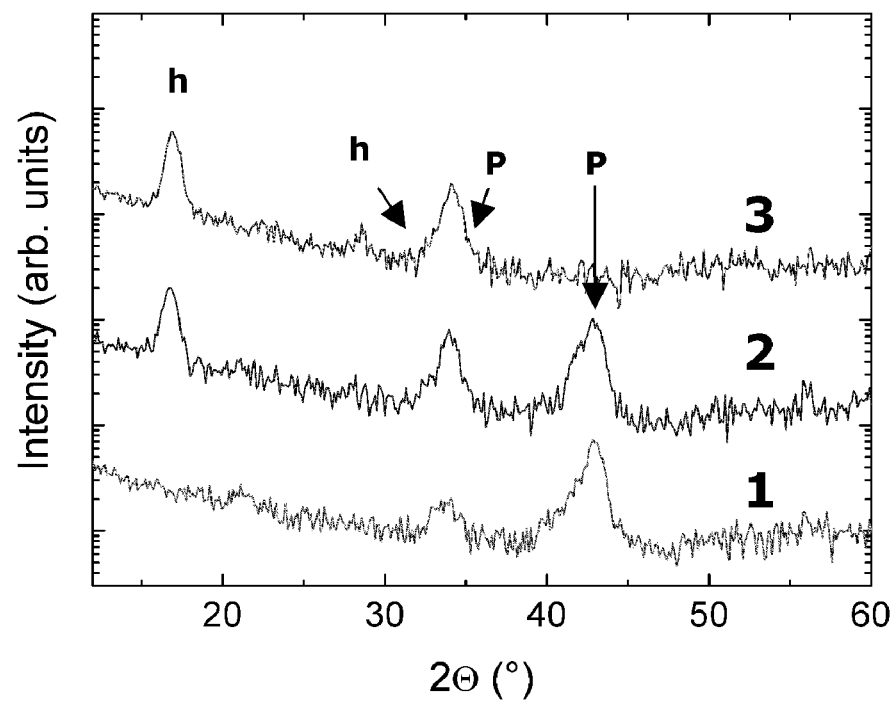
FIG. 7 represents the GIXRD patterns of the annealed (1050° C., 30s, N₂) dielectric stack composed of 12 nm LuAlO₃ on a scaled LuAlO₃/γ-Al₂O₃ template: (1) 4 nm LaAlO₃/4 nm γ-Al₂O₃; (2) 4 nm LaAlO₃/3 nm γ-Al₂O₃; (3) 3 nm LaAlO₃/4 nm γ-Al₂O₃, wherein 'p' indicates a perovskite peak and 'h' a hexagonal peak.

FIG. 7 represents the GIXRD patterns of the annealed (1050° C., 30s, N$_2$) dielectric stack composed of 12 nm LuAlO$_3$ on a scaled LaAlO$_3$/γ-Al$_2$O$_3$ template stack: (1) 4 nm LaAlO$_3$/4 nm γ-Al$_2$O$_3$; (2) 4 nm LaAlO$_3$/3 nm γ-Al$_2$O$_3$; (3) 3 nm LaAlO$_3$/4 nm γ-Al$_2$O$_3$, wherein 'p' indicates a peak corresponding to the perovskite phase and 'h' a peak corresponding to the hexagonal phase.

The LaAlO$_3$/γ-Al$_2$O$_3$ template stack can be scaled down to lower thicknesses. However there is a lower limit for both upper and lower template layers (about 4 nm each) that guarantees the optimum working of the template stack. As shown in FIG. 7, curve (1) represents a perovskite structure, while curve (2) and (3) show the presence of peaks that correspond to a hexagonal structure next to the perovskite one.

Advantageously, the SrTiO$_3$ (STO) upper template layer can be scaled down successfully to lower thicknesses such as to comply with the most stringent scaling requirements of the flash memory devices.

Figure 8:
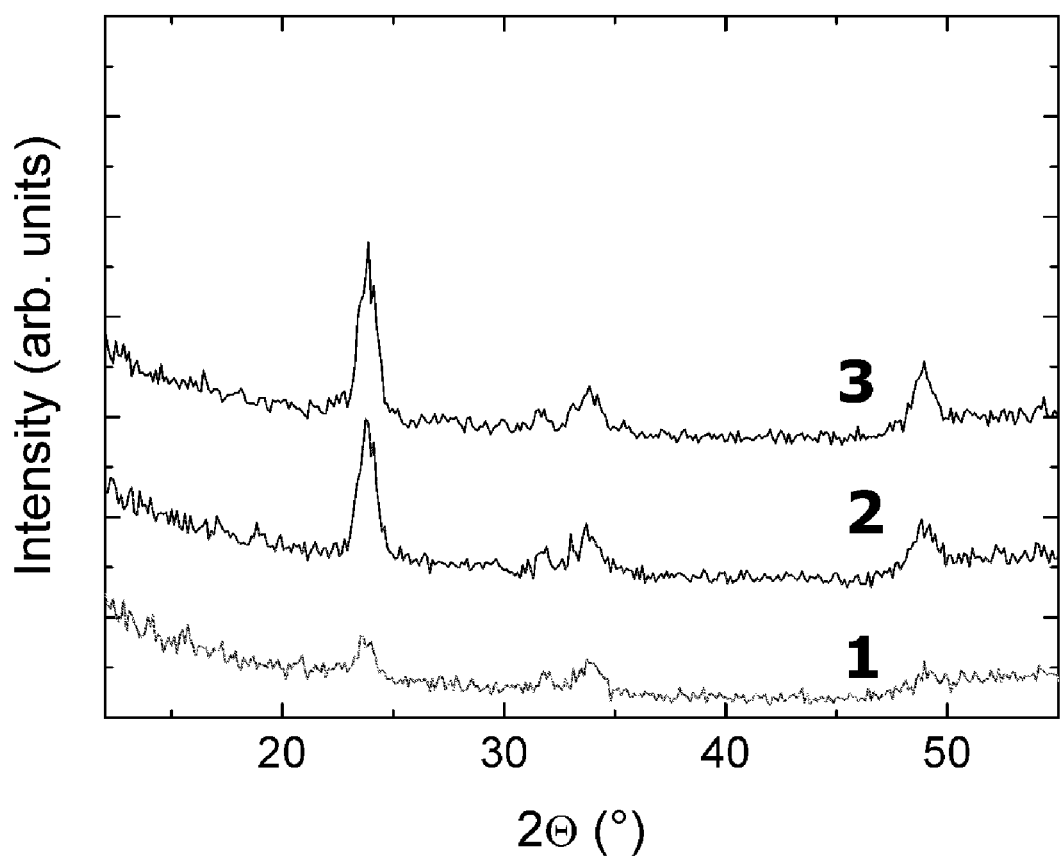
FIG. 8 represents the GIXRD patterns of the annealed (950° C., 30s, N₂) dielectric stack composed of 12 nm GdAlO₃ and a scaled STO template: (1) 4 nm STO; (2) 3 nm STO; (3) 2 nm STO.

FIG. 8 represents the GIXRD patterns of the annealed (950° C., 30 s, N$_2$) dielectric stack composed of 12 nm GdAlO$_3$ and a scaled STO upper template layer: (1) 4 nm STO; (2) 3 nm STO; (3) 2 nm STO. As shown, the STO upper template layer can be perfectly scaled down up to 2 nm.

In another aspect of the disclosure, a semiconductor device comprising a rare-earth aluminate dielectric layer is disclosed, wherein the REAlO$_3$ dielectric layer has a perovskite crystalline structure at temperatures compatible with semiconductor manufacturing and wherein the rare-earth aluminate comprises a rare-earth element (RE) having an atomic number higher or equal with 63 (Eu) and lower or equal with 71 (Lu).

In one preferred aspect of the disclosure, the semiconductor device comprises further: a template stack comprising at least an upper template layer, wherein the upper template layer has a perovskite structure, and wherein the upper template layer is underlying and in contact with the REAlO$_3$ dielectric layer.

According to one preferred aspect of the disclosure, it is provided a flash memory device comprising the REAlO$_3$ dielectric layer, wherein the REAlO$_3$ dielectric layer has a perovskite crystalline structure at temperatures compatible with semiconductor manufacturing and wherein the rare-earth aluminate comprises a rare-earth element (RE) having an atomic number higher or equal with 63 (Eu) and lower or equal with 71 (Lu).

According to one specific execution, the flash memory device comprises further: a template stack comprising at least an upper template layer, wherein the upper template layer has a perovskite structure, and wherein the upper template layer is underlying and in contact with the REAlO$_3$ dielectric layer.

Figure 9:
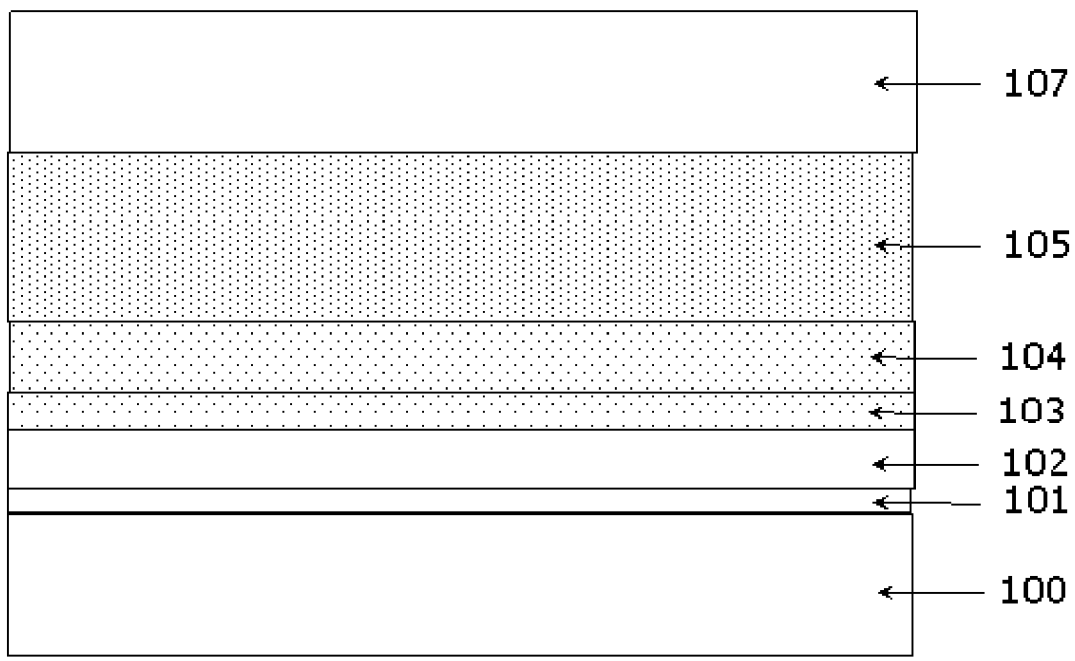
FIG. 9 represents schematically the dielectric stack of the disclosure in a typical flash memory configuration: substrate/channel region (100), tunnel insulating layer (101), charge trapping layer (102), lower template layer (103) upper template layer (104), REAlO₃ dielectric (blocking) layer (105), and control electrode (107).

The flash memory device may comprise other dielectric and/or conductive layers as described further herein. FIG. 9 represents schematically a dielectric stack in a typical flash memory configuration: substrate/channel region (100), tunnel insulating layer (101), charge trapping layer (102), lower template layer (103) upper template layer (104), REAlO$_3$ dielectric (blocking) layer (105), and control electrode (107).

Figure 10:
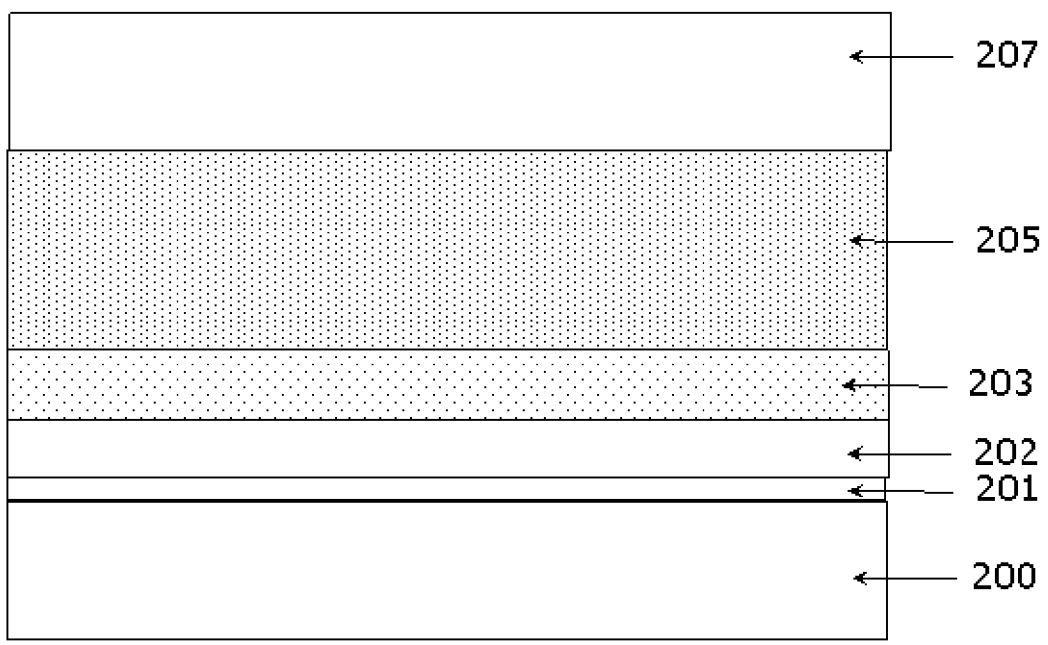
FIG. 10 represents schematically the dielectric stack of the disclosure in a typical flash memory configuration: substrate/channel region (200), tunnel insulating layer (201), charge trapping layer (202), upper template layer (203), REAlO₃ dielectric (blocking) layer (205), and control electrode (207).

FIG. 10 represents schematically another dielectric stack in a typical flash memory configuration: substrate/channel region (200), tunnel insulating layer (201), charge trapping layer (202), upper template layer (203), REAlO$_3$ dielectric (blocking) layer (205), and control electrode (207).

The tunnel insulating layer (101, 201) may be a tunneling oxide layer. The tunnel insulating layer may be formed of SiO$_2$, high-κ dielectric layer or combinations thereof. Alternatively, the tunnel insulating layer may be formed of silicon nitride (Si$_3$N$_4$).

The charge trapping layer (102, 202) may trap charges such as to store information. The charge trapping layer may be formed of polysilicon, nitride, a high-κ dielectric material or may include a plurality of nanodots functioning as charge trap sites.

The control electrode (107, 207) may be formed of a metal layer. For example, the gate electrode can be formed of Al, TaN or a metal silicide (e.g. NiSi).

Optionally, a cap layer (106, 206. not shown) can be inserted in between the REAlO$_3$ dielectric (blocking) layer (105, 205) and the control electrode (107, 207). The cap layer can be made of dielectric material with a high-K value which improves the interface properties between the REAlO$_3$ dielectric (blocking) layer and the control electrode.

In another aspect of the disclosure, a method for manufacturing a dielectric stack is described comprising the following steps: (a) forming (depositing/growing) a lower template layer consisting of amorphous Al$_2$O$_3$ on a substrate, thereafter (b) applying a thermal treatment to (or annealing) the substrate comprising the lower template layer, thereby forming a crystalline gamma-alumina (γ-Al2O3), thereafter (c) forming (depositing/growing) an upper template layer overlying the crystalline γ-Al2O3, wherein the upper template layer consists of LaAlO$_3$, (d) applying a thermal treatment to (annealing) the substrate comprising the upper template layer, thereby forming a crystalline LaAlO$_3$ with a perovskite structure, (e) forming (depositing/growing) a REAlO$_3$ dielectric layer overlying the upper template layer, wherein the REAlO$_3$ dielectric layer comprises a rare-earth element with the atomic number higher or equal with 63 (Eu) and lower or equal with 71 (Lu), thereafter (f) applying a thermal treatment to (annealing) the substrate comprising the REAlO$_3$ dielectric layer, thereby forming a crystalline REAlO$_3$ layer with a perovskite structure.

In one preferred aspect of the method of the disclosure, annealing the substrate comprising the lower template layer, thereby forming a crystalline gamma-alumina, is performed at a temperature between 850° C. and 1100° C., preferably at about 850° C. for a duration of about 30 s in N$_2$ ambient.

In one preferred aspect of the method of the disclosure, the upper template layer is deposited on the crystallized gamma-alumina and consists of LaAlO$_3$.

According to a preferred execution of the method of the disclosure, annealing the substrate comprising the upper template layer, thereby forming a crystalline LaAlO$_3$ with a perovskite structure, is performed at a temperature between 950° C. and 1100° C., preferably at about 1000° C. for about 30 s in N$_2$ ambient.

In specific aspects of the disclosure wherein a lower and an upper template layer are used (e.g. γ-Al$_2$O$_3$ underlying LaAlO$_3$), annealing the substrate comprising the rare-earth aluminate dielectric layer, thereby forming a crystalline REAlO$_3$ with a perovskite structure, is preferably performed at a temperature between about 950° C. and about 1050° C., more preferably at 1050° C. for about 30 s in N$_2$ ambient.

In the particular example of GdAlO$_3$ on γ-Al$_2$O$_3$/LaAlO$_3$ template stack, annealing to form perovskite GdAlO$_3$ is preferably performed at a temperature between 780° C. and 1050° C.

Alternatively, in the particular example of LuAlO$_3$ on γ-Al$_2$O$_3$/LaAlO$_3$ template stack, annealing to form perovskite LuAlO$_3$ is preferably performed at a temperature between 910° C. and 1050° C.

The duration of the different thermal treatment (anneal) steps can be between 1 s to several minutes, most preferably between 30 s and 1 minute. The ambient can be O$_2$, N$_2$ or any other inert gas (noble gas such as Ar, He).

In some aspects of the disclosure, the thermal treatments at step (d) and step (f) as above-described can be performed simultaneously, after forming (depositing) the rare-earth aluminate layer (step (e)). Advantageously the total processing time is shortened, which is very important for manufacturing.

According to another aspect, the method for manufacturing a dielectric stack comprises the following steps: (a) forming (depositing/growing) an upper template layer overlying a substrate, wherein the upper template comprises/consists of SrTiO$_3$, thereafter (b) applying a thermal treatment to (or annealing) the substrate comprising the upper template layer, thereby forming a crystalline SrTiO$_3$ having a perovskite structure, (c) forming (depositing/growing) a REAlO$_3$ dielectric layer overlying the upper template layer, wherein the REAlO$_3$ dielectric layer comprises a rare-earth element with the atomic number higher or equal with 63 (Eu) and lower or equal with 71 (Lu), thereafter (d) applying a thermal treatment to (annealing) the substrate comprising the REAlO$_3$ dielectric layer, thereby forming a crystalline rare-earth aluminate REAlO$_3$ layer having a perovskite structure.

In preferred aspects of the disclosure, annealing the substrate comprising a SrTiO$_3$ upper template layer, thereby forming a crystalline SrTiO$_3$ with a perovskite structure is performed at a temperature between 600° C. and 800° C., for a duration of 30 s in N$_2$ ambient. The anneal temperature required depends on the thickness of the STO layer, e.g. for a thin layer of about 2 nm the anneal temperature should be about 800° C.

In the specific aspect of the disclosure wherein an upper template layer comprising (or consisting of) SrTiO$_3$ is disclosed, annealing the substrate comprising the rare-earth aluminate dielectric layer, thereby forming a crystalline REAlO$_3$ with a perovskite structure, is preferably performed at a temperature between about 930° C. and 1000° C. for a duration of about 30s in N$_2$ ambient. A temperature above 1000° C. is not recommended since the STO template layer is not stable above this temperature.

In one preferred aspect of the method of the disclosure, the REAlO$_3$ dielectric layer consists of LuAlO$_3$.

In another preferred aspect of the method of the disclosure, the REAlO$_3$ dielectric layer consists of GdAlO$_3$.

In the particular example of GdAlO$_3$ on STO template, annealing to form perovskite GdAlO$_3$ is preferably performed at a temperature between 830° C. and 1000° C.

Alternatively, in the particular example of LuAlO$_3$ on STO template, annealing to form perovskite LuAlO$_3$ is preferably performed at a temperature between 930° C. and 1000° C.

In alternative aspects of the disclosure, other dielectric materials having a perovskite structure or having the capability to crystallize in a perovskite structure at temperatures compatible with the semiconductor manufacturing, when overlying and in contact with a crystalline dielectric (a lower template layer) can be used as an upper template layer. Such alternative dielectric materials suitable for use herein may be easily identified by those skilled in the art of semiconductor processing in the light of the present disclosure.

In another aspect of the disclosure, a method for manufacturing a dielectric stack is disclosed, comprising the following steps: (a) forming (depositing/growing) an upper template layer overlying a substrate, (b) applying a thermal treatment to (annealing) the substrate comprising the upper template layer, thereby forming a crystalline upper template layer with a perovskite structure, (c) forming (depositing/growing) a REAlO$_3$ dielectric layer overlying the crystalline upper template layer, wherein the REAlO$_3$ dielectric layer comprises a rare-earth element with the atomic number higher or equal with 63 (Eu) and lower or equal with 71 (Lu), thereafter (d) applying a thermal treatment to (annealing) the substrate comprising the REAlO$_3$ dielectric layer, thereby forming a crystalline REAlO$_3$ layer with a perovskite structure.

In specific aspects of the disclosure wherein only one upper template layer is employed (or, in other words, the template stack consists of a upper template layer), the thermal treatments at step (b) and step (d) of the method can be performed simultaneously, after forming (depositing) the REAlO$_3$ layer (step (c)). Advantageously the total processing time is shortened, which is very important for manufacturing.

According to still another aspect, the present disclosure relates to the use of a dielectric layer or a dielectric stack as described above in the manufacture of a semiconductor device, preferably a flash memory device.

What is claimed is:

1. A dielectric stack comprising:
   a dielectric layer comprising a rare-earth aluminate of formula RE$_x$Al$_{2-x}$O$_3$ wherein RE a rare earth element, Al is aluminum, and O is oxygen, and wherein 0<x<2, wherein the rare-earth aluminate has a perovskite crystalline structure, and wherein the rare-earth element has an atomic number greater than or equal to 63 and less than or equal to 71;
   a template stack, the template stack comprising an upper template layer, wherein the upper template layer has a perovskite structure, and wherein the upper template layer is underlying and in contact with the dielectric layer comprising a rare-earth aluminate, and
   a lower template layer having a crystalline structure, wherein the lower template layer is underlying and in contact with the upper template layer.

2. The dielectric layer of claim 1, wherein the perovskite crystalline structure is stable at temperatures lower than 1400° C.

3. The dielectric layer of claim 1, having a thickness of less than 1 μm.

4. The dielectric layer of claim 1, wherein a ratio of RE to Al in the rare-earth aluminate is about 1:1.

5. The dielectric layer of claim 1, wherein RE is Lu, and wherein x is about 1.

6. The dielectric layer of claim 1, wherein RE is Gd, and wherein x is about 1.

7. The dielectric stack of claim 1, wherein the lower template layer comprises γ-Al$_2$O$_3$.

8. A memory device comprising a dielectric stack according to claim 1.

9. A method for manufacturing a dielectric stack on a substrate, wherein the method comprises the steps of:
   forming an upper template layer overlying a substrate;
   applying a thermal treatment to the upper template layer, whereby a crystalline upper template layer having a perovskite structure is formed;
   forming a dielectric layer comprising a rare-earth aluminate of formula RE$_x$Al$_{2-x}$O$_3$ wherein RE a rare earth element, Al is aluminum, and O is oxygen, and wherein 0<x<2, wherein the rare-earth element has an atomic number greater than or equal to 63 and less than or equal to 71, the dielectric layer overlying the crystalline upper template layer; and
   applying a thermal treatment to the dielectric layer, whereby a dielectric layer according to claim 1 having a perovskite structure is obtained.

10. The method of claim 9, further comprising forming a lower template layer having a crystalline structure on the substrate, wherein the lower template is underlying and in contact with the upper template layer.

11. The method of claim 10, wherein the lower template layer comprises a crystalline γ-Al$_2$O$_3$ layer.

12. The method of claim 11, wherein forming a lower template layer comprises:
   forming a lower template layer comprising amorphous Al$_2$O$_3$ and overlying the substrate; and
   applying a thermal treatment to the lower template layer, whereby a crystalline γ-Al$_2$O$_3$ layer is formed.

13. The method of claim 9, wherein the upper template comprises LaAlO$_3$.

14. The method of claim 9, wherein the upper template comprises SrTiO$_3$.

15. The method of claim 9, wherein the rare-earth aluminate is LuAlO$_3$.

16. The method of claim 9, wherein the rare-earth aluminate is GdAlO$_3$.

17. The method of claim 9, wherein the dielectric stack forms a part of a memory device.

18. A dielectric stack comprising:
   a dielectric layer comprising a rare-earth aluminate of formula RE$_x$Al$_{2-x}$O$_3$ wherein RE a rare earth element, Al is aluminum, and O is oxygen, and wherein 0<x<2, wherein the rare-earth aluminate has a perovskite crystalline structure, and wherein the rare-earth element has an atomic number greater than or equal to 63 and less than or equal to 71; and
   a template stack, the template stack comprising an upper template layer, wherein the upper template layer has a perovskite structure, wherein the upper template layer comprises LaAlO$_3$, and wherein the upper template layer is underlying and in contact with the dielectric layer comprising a rare-earth aluminate.

19. A memory device comprising a dielectric stack according to claim 18.

20. The dielectric layer of claim 18, wherein the perovskite crystalline structure is stable at temperatures lower than 1400° C.

21. The dielectric layer of claim 18, having a thickness of less than 1 μm.

22. The dielectric layer of claim 18, wherein a ratio of RE to Al in the rare-earth aluminate is about 1:1.

23. The dielectric layer of claim 18, wherein RE is Lu, and wherein x is about 1.

24. The dielectric layer of claim 18, wherein RE is Gd, and wherein x is about 1.

25. A dielectric stack comprising:
   a dielectric layer comprising a rare-earth aluminate of formula RE$_x$Al$_{2-x}$O$_3$ wherein RE a rare earth element, Al is aluminum, and O is oxygen, and wherein 0<x<2, wherein the rare-earth aluminate has a perovskite crystalline structure, and wherein the rare-earth element has an atomic number greater than or equal to 63 and less than or equal to 71; and
   a template stack, the template stack comprising an upper template layer, wherein the upper template layer has a perovskite structure, wherein the upper template layer comprises SrTiO$_3$, and wherein the upper template layer is underlying and in contact with the dielectric layer comprising a rare-earth aluminate.

26. A memory device comprising a dielectric stack according to claim 25.

27. The dielectric layer of claim 25, wherein the perovskite crystalline structure is stable at temperatures lower than 1400° C.

28. The dielectric layer of claim 25, having a thickness of less than 1 um.

29. The dielectric layer of claim 25, wherein a ratio of RE to Al in the rare-earth aluminate is about 1:1.

30. The dielectric layer of claim 25, wherein RE is Lu, and wherein x is about 1.

31. The dielectric layer of claim 25, wherein RE is Gd, and wherein x is about 1.

* * * * *

UNITED STATES PATENT AND TRADEMARK OFFICE
CERTIFICATE OF CORRECTION

PATENT NO. : 8,405,166 B2
APPLICATION NO. : 12/962288
DATED : March 26, 2013
INVENTOR(S) : Adelmann et al.

It is certified that error appears in the above-identified patent and that said Letters Patent is hereby corrected as shown below:

In the Specification:

In column 2 at line 34, Change "$(RE_xAl_{2-2}O_3)$" to --$(RE_xAl_{2-x}O_3)$--.

In column 7 at line 24, Change "$LuAlO_3/10$ nm $\gamma$-$Al_2O_3$," to -- $LaAlO_3/10$ nm $\gamma$-$Al_2O_3$,--.

In column 7 at line 29, Change "$LuAlO_3/\gamma$-$Al_2O_3$" to --$LaAlO_3/\gamma$-$Al_2O_3$--.

In column 8 at line 23, Change "($\gamma$-value)" to --($\kappa$-value)--.

In column 14 at line 65, Change "high-x" to --high-$\kappa$--.

In column 15 at line 7, Change "high-K" to --high-$\kappa$--.

In the Claims:

In column 17 at line 24, In Claim 1, change "aluminate," to --aluminate;--.

Signed and Sealed this
Twenty-fourth Day of September, 2013

Teresa Stanek Rea
*Deputy Director of the United States Patent and Trademark Office*